United States Patent
Gannon

[19]

[11] Patent Number: 5,916,401
[45] Date of Patent: Jun. 29, 1999

[54] COATING OF SUBSTRATES

[75] Inventor: Raymond P Gannon, Brisbane, Australia

[73] Assignee: The University of Queensland, St. Lucia, Australia

[21] Appl. No.: 08/718,509

[22] PCT Filed: Apr. 5, 1995

[86] PCT No.: PCT/AU95/00194

§ 371 Date: Oct. 4, 1996

§ 102(e) Date: Oct. 4, 1996

[87] PCT Pub. No.: WO95/26935

PCT Pub. Date: Oct. 12, 1995

[30] Foreign Application Priority Data

Apr. 5, 1994 [AU] Australia ............................ PM 4840
Dec. 22, 1994 [AU] Australia ............................ PN 0260

[51] Int. Cl.⁶ .......................... B32B 31/12; C03C 17/00; B44C 1/00
[52] U.S. Cl. .......................... 156/240; 156/230; 156/236; 156/239; 156/307.3; 156/308.2
[58] Field of Search ...................... 156/89, 230, 233, 156/239, 278, 308.2, 307.3, 307.5, 309.6, 236, 240

[56] References Cited

U.S. PATENT DOCUMENTS

| | | | |
|---|---|---|---|
| 3,266,661 | 8/1966 | Dates ................................. | 156/89 X |
| 3,521,941 | 7/1970 | Deb et al. . | |
| 3,615,560 | 10/1971 | Jonker et al. . | |
| 3,615,980 | 10/1971 | Schuck et al. ...................... | 156/89 |
| 3,655,496 | 4/1972 | Ettre et al. ........................ | 156/89 X |
| 3,658,611 | 4/1972 | Gray ................................... | 156/89 |
| 4,242,159 | 12/1980 | Klimmek et al. .................. | 156/230 X |
| 4,448,622 | 5/1984 | Duchane et al. .................. | 156/230 X |
| 4,469,774 | 9/1984 | Lee . | |
| 4,478,660 | 10/1984 | Landler et al. .................. | 156/308.2 X |
| 4,573,768 | 3/1986 | Polak et al. . | |
| 4,622,240 | 11/1986 | Yext et al. . | |
| 4,753,694 | 6/1988 | Herron et al. . | |
| 5,218,757 | 6/1993 | Kaneko et al. . | |
| 5,302,562 | 4/1994 | Bezama et al. . | |
| 5,380,391 | 1/1995 | Mahn, Jr. .......................... | 156/230 X |
| 5,480,503 | 1/1996 | Casey et al. ...................... | 156/235 X |

FOREIGN PATENT DOCUMENTS

| | | |
|---|---|---|
| 900-147 | 1/1985 | Belgium . |
| 59-190240 | 10/1984 | Japan . |
| 60-5042 | 1/1985 | Japan . |
| 61-16573 | 7/1986 | Japan . |
| 63-159237 | 7/1988 | Japan . |
| 3-271135 | 12/1991 | Japan . |
| 5-070176 | 3/1993 | Japan . |
| 5-221691 | 8/1993 | Japan . |
| 640982 | 1/1979 | U.S.S.R. . |
| 1 258 660 | 12/1971 | United Kingdom . |
| 1 379 366 | 1/1975 | United Kingdom . |

*Primary Examiner*—Curtis Mayes
*Attorney, Agent, or Firm*—Nixon & Vanderhye P.C.

[57] ABSTRACT

A coating is applied to a substrate using an intermediate membrane. The coating is typically conductive or semiconducting, and the substrate is typically glass. In one form, the coating is applied, in one or more layers, to a flat flexible membrane. The membrane is then placed on the substrate, and the combination is treated under controlled conditions in a heating chamber. The combination is first heated in a neutral atmosphere to cause volatisation of the sacrificial membrane, then successively in oxidising and reducing conditions to cause strong bonding between the coating and the substrate. In another form, a non-sacrificial membrane has a substrate contact surface which is physically and chemically compatible with the substrate and which, when treated either chemically or thermally, forms a bond with the substrate.

23 Claims, 2 Drawing Sheets

COATING OF SUBSTRATES

THIS INVENTION relates to a process for producing effective adhesion of one or more coatings to a substrate. More particularly, this invention is directed to the application of a conducting or semi-conducting coating onto a non-conducting substrate, typically glass of curved or complex shape, although the invention is not limited to this particular application.

BACKGROUND ART

In most known industrial processes in which metallic or conducting films are applied to glass or other non-conducting substrates, such as in commercial mirror production, the adhesion properties of the film (although an advantage) are not of major importance. Subsequent metallic or organic coatings protect the film from damage likely to result in loss of film adhesion.

In other coating processes such as occur in the production of printed circuit boards, a metallic coating is deposited onto a plastic, ceramic or other non-conducting substrate, which has been prepared in such a way as to provide mechanical anchorage for the coating. The surface preparation may require the use of etching, sandblasting or the like. The use of gaseous and chemical reducing agents may also be employed to assist metal deposition on said substrates.

Vacuum vapour evaporation and sputtering are other known methods of producing such coatings on substrates. In these processes, the interface between the substrate and coating is generally distinct, which in many cases produces poor relative adhesion. These processes also produce coatings of limited thickness.

In other known processes such as those used to produce semi-conducting components for the electronics industry, migration of semi-conducting and/or conducting films into the surface of a chosen substrate has been successfully achieved. The films produced by surface migration processes generally exhibit good relative bond strength. However, this is often of little advantage as the subsequent function of these films is not necessarily dependent on the mechanical strength of their surface adhesion.

The main disadvantage of such films arises when it is necessary to increase the thickness or modify the surface migration films. Increase in film thickness is usually achieved by using one of a number of standard techniques, which may include vacuum deposition, electroless plating, ion displacement, and electroplating. The techniques and processes which are currently used to increase film thicknesses are costly, cumbersome, and size restrictive.

Further, it is generally understood that when migration processes produce a surface coating, the coating may exhibit physical and chemical properties which differ from the individual characteristics of the materials involved. It is therefore likely that a conducting or semi-conducting coating, produced by a surface migration process, may exhibit properties which make it difficult or impossible to subsequently increase its thickness.

Some existing processes require the use of an intermediate coating such as an adhesive to produce effective substrate-to-conducting film bond strengths. These composite coatings have many disadvantages, including temperature and solvent sensitivity. In addition, the presence of the intermediate coating may interfere with the subsequent use of the coated substrate.

Additional problems are encountered with existing methods when producing precision delineated patterns of conducting and/or semi-conducting coatings on nonconducting substrates. Stencils, masks, resists, post-etching and the like, are devices and processes currently used to create such delineated patterns of conducting or non-conducting coatings on substrates. Stencils and similar devices are difficult to maintain during the aggressive heating and other physical and chemical treatments used to establish the coating delineation.

Finally, known methods of applying coatings to substrates are generally designed for flat substrates, and are not particularly suitable for curved substrate surfaces.

It is an object of the present invention to provide an improved method of applying a coating to a non-conducting substrate, which overcomes or ameliorates at least some of the abovedescribed disadvantages of prior art coating methods.

It is a preferred object of the present invention to provide a coating technique whereby precision delineation of a conductive or semi-conductive coating pattern can be prepared with accuracy and wherein the precision pattern is maintained during heat treatment or other physical and chemical processing.

It is a further preferred object of the invention to provide an effective means of producing precision delineated conducting or semi-conducting multi-layer coatings on non-conducting substrates.

SUMMARY OF THE INVENTION

In one broad form, the present invention provides a method of applying a coating to a non-conducting substrate, the method comprising the steps of depositing the coating on a membrane, placing the membrane on the substrate, treating the substrate, membrane and coating combination under controlled conditions so as to remove the membrane and enable the coating to bond to the substrate.

Typically, the coating is a thin conducting or non-conducting layer.

In a preferred form of the invention, the membrane comprises a material which volatilises without substantial residue on heating. After the coated membrane is placed on the substrate, the substrate is subjected to heat treatment in the range of 80° C.–3,800° C., and typically 600–1200° C. Such heating is preferably performed in a controlled atmosphere, precisely alternating between neutral, oxidising and reducing conditions. The heating may be by direct or indirect means.

When subjected to such heating, the membrane volatilises without leaving any substantial residue. Furthermore, by using selected heat treatment in controlled atmospheric conditions, a sintering and fusing effect can be obtained, whereby the coating material migrates into the substrate. (If there is more than one coating layer, homogeneous fusing of the other layers in the coating can also be achieved).

The membrane material may suitably be a chemical such as diethylene glycol monosterate, or polyvinyl alcohol. The membrane material may alternatively comprise cellulose crosslinked matrix combined with starch.

The membrane may suitably be prepared by coating a surface with such chemical(s) and or material(s) to a suitable thickness (less than 150 microns). Once the chemical has set to a dry flexible membrane condition, it is removed from the surface. The surface is preferably pretreated with a release coating such as silicone or TEFLON™ (PTFE) to facilitate removal of the membrane.

A typical membrane size is approximately 300 mm×480 mm. However, areas as large as 6 m×50 m can be produced using a continuous coating process.

In a further embodiment, the membrane comprises a substrate contact material which volatilises without substantial residue, and is coated with a flexible sol-gel preparation containing fusible materials.

In another form of the invention, the membrane comprises a material which is wholly or partly dissolvable in a solvent solution. The combination is placed in the solvent such that the membrane is dissolved, allowing the coating to bond to the substrate.

In yet another form of the invention, the membrane has a substrate contact material which is chemically and physically compatible with the substrate material, and which on subsequent heat and/or chemical treatment, forms an adherent bond with the substrate.

One such substrate contact material is a compounded silica gel.

Other suitable materials for the membrane include a flexible gel prepared from a suspension of silicates and borates incorporating a PVA binder. Similar water soluble or oil based polymers can be used as binders and gel formers. In some cases, delineated layers of coating materials may be "printed" on an initial "membrane" of gold leaf.

The coating may suitably comprise such conducting materials as gold, platinum, silver, rhodium, copper, and palladium. The coating may be applied to the membrane as a metallic layer. Alternatively, the coating can be applied to the membrane by silk screen printing. In the latter method, metals or insulating materials are in the form of fine powders (less than 10 microns) optionally dispersed in a binder/ink liquid medium. A suitable binder/ink medium for such metallic powders is ethyl cellulose in terpineol.

In another embodiment, the coating may be in the form of a colloidal solution, or ink-like suspension, which is painted onto the membrane to adhere thereto.

The coating is normally applied to the membrane in a precision delineated pattern. The position and patterning of the coating on the membrane may be achieved by photolithographic or other known printing methods.

In another embodiment of the invention, a plurality of layers of conducting, semi-conducting and/or non-conducting materials are deposited on the membrane using vacuum evaporation and/or sputtering techniques. Precise delineated patterns of the coating(s) are achieved by the use of stencils of appropriate materials, such as photosensitive emulsions and the like.

In yet another embodiment of the invention, the coating may be deposited on the membrane as a layer on or under which has been deposited one or more other layers of material. Such other layer materials may be conducting, semi-conducting, insulating and/or able to generate localised oxidising or reducing conditions.

Conducting and/or semi-conducting interconnections can be made between selected coating layers. Such interconnections provide means whereby electrical connections can be made to a single layer and/or to a plurality of the coating layers.

The coating may also comprise a fluxing material to assist the joining or fusing of the coating to the substrate and/or other layers of conducting/semi-conducting or insulating material on the substrate. One suitable fluxing material is a borax compound incorporating glass powder and/or metal oxides.

In a particular application of the invention, the coating may comprise photosensitive and/or electro-chromatic compounds. When placed on a glass substrate, the photosensitive or electro-chromatic coating can be used to change the optical characteristics of the coat glass, from opaque to transparent, or through various shades of tinting.

Typically, the substrate is glass. Indexing of the coated membrane on the glass substrate can be achieved by conventional means, such as vacuum, table and/or roller, pick and place.

The glass substrate may be flat, or curved. For a cylindrical or other curved substrate, a vacuum or electro-static roller pick up and transfer mechanism is considered most effective for precision indexing.

Alternative substrate materials include borosilicate glass, fused quartz, glass ceramics, and refractory ceramics. Mineral compound materials such as alumino-silicates, and known doped semi-conducting materials may also be used as the substrate.

In order that the invention may be more fully understood and put into practice, examples thereof will now be described with reference to the accompanying figures.

DETAILED DESCRIPTION OF PREFERRED EMBODIMENTS

EXAMPLE 1

A thermally volatile membrane is coated with a conductive metallic layer in a precision delineated pattern. The membrane is a flexible layer of diethylene glycol monosterate, a polyvinyl alcohol, cellulose crosslinked matrix combined with starch, or other suitable material.

The conductive coating comprises fine metallic powder, such as copper particles, suspended in a binder/ink medium, which is applied to the membrane in a silk screening process. One or more such coating layers may be applied to the membrane. The pattern of the conductive layer can be selected to provide a particular electrical component, or to create a desired electromagnetic field in the finished product.

The coated membrane is placed on a substrate, such as a glass cylinder.

Figure 1:
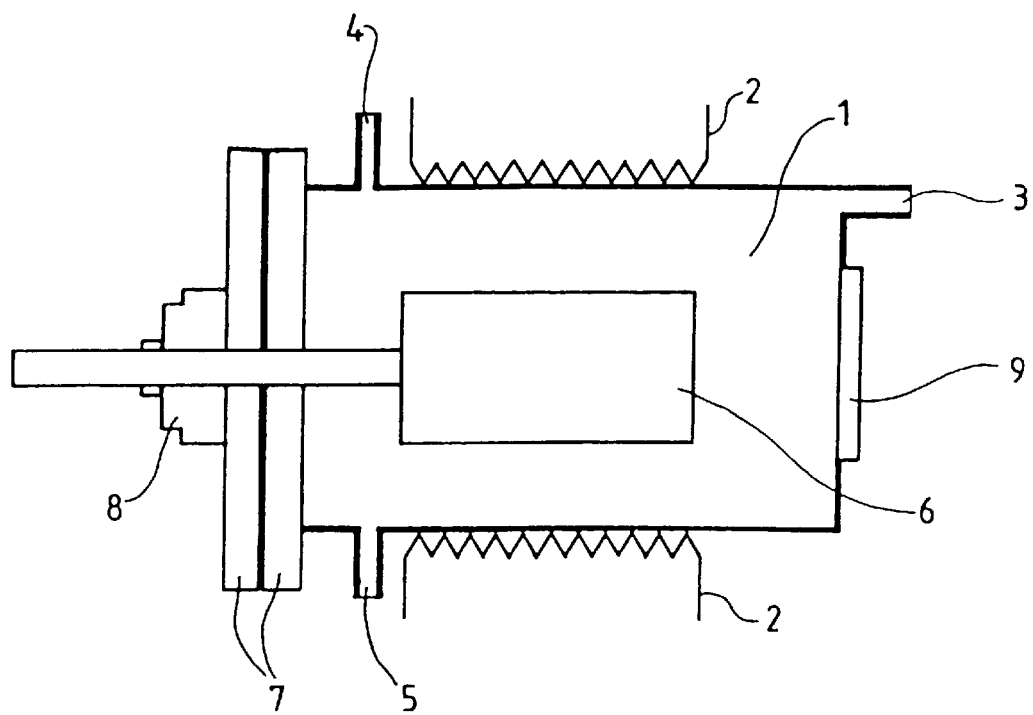
FIG. 1 is a schematic elevation of a heating chamber used in the examples.

The glass cylinder is then placed in a high temperature vacuum chamber 1, such as that illustrated in FIG. 1. The interior of chamber 1 is heated by heating elements 2 on the outside thereof. The chamber 1 is also provided with a gas port 3, and exhaust/vacuum port 4, and an ionised vapour port 5. The glass cylinder (not shown) is placed on a substrate sample holder 6 and introduced into the chamber 1. The chamber is then sealed by sealable flange assembly 7, which includes a rotatable vacuum seal assembly 8. An observation window 9 is conveniently provided on the chamber 1.

The chamber 1 can be constructed using stainless steel casing and fittings, together with high temperature ceramic/refractory linings. Although generalised heating of the chamber can be achieved by the heating elements 2, precision localised heating can be achieved by focussed laser via suitably positioned observation ports in the chamber housing and lining. High frequency induction heating can also be used to provide a further and/or alternative heat source.

Another preferred process heating means is a channeled high voltage plasma flame.

The gases used in the controlled atmosphere within chamber 1 may include nitrogen, hydrogen, acetylene, propane, oxygen, fluorine, or prepared mixtures of these. Other selected gases can also be used to create surface etching and sensitising effects on particular substrates.

After the glass cylinder has been introduced into chamber 1 and the chamber sealed, the temperature within the chamber is raised at a rate of 5° C. per minute, from ambient up to 120° C., to remove moisture. During this moisture removal step, dry nitrogen is passed through the chamber, at a typical flow rate of 100 ml per min, to flush out moisture.

The temperature is then raised, in a low pressure (25 mb) dry nitrogen atmosphere, at a rate of 10° C. per minute up to about 620° C., to cause volatilisation of the membrane. (The membrane is selected from material(s) which leave(s) no substantial residue on volatilisation).

Thereafter, the temperature is maintained at about 620° C. for approximately 15 minutes (although this period may vary depending on the materials used and the substrate migration depth required). Such heating is carried out in an oxidising atmosphere which can be achieved by passing dry air or an oxygen mixture (e.g. 80% oxygen 20% nitrogen, or 80% oxygen 20% fluorine) through the chamber at a typical flow rate of 100 ml per min.

Following the oxidisation step, the temperature is raised from 620° C. to approximately 1200° C. and maintained for a "soak" time of approximately 15 minutes (although this period can vary, depending on the material used, the substrate and the depth of interlayer migration required). During this high temperature process, sintering of the coating to the substrate occurs. This sintering step occurs in a reducing atmosphere, typically achieved by passing hydrogen through the chamber at a flow rate of around 100 ml per min.

The substrate is then allowed to cool to around 580° C., and maintained at that temperature for approximately 20 minutes (although this can be varied to suit the particular substrate material). The temperature is then further reduced gradually to 20° C. over a period of four hours. The cooling process occurs in a neutral atmosphere, typically dry nitrogen, at a flow rate of 100 ml per min.

In the finished product, a strong bond is formed between the conductive metallic layer and the glass substrate.

EXAMPLE 2

Figure 2:
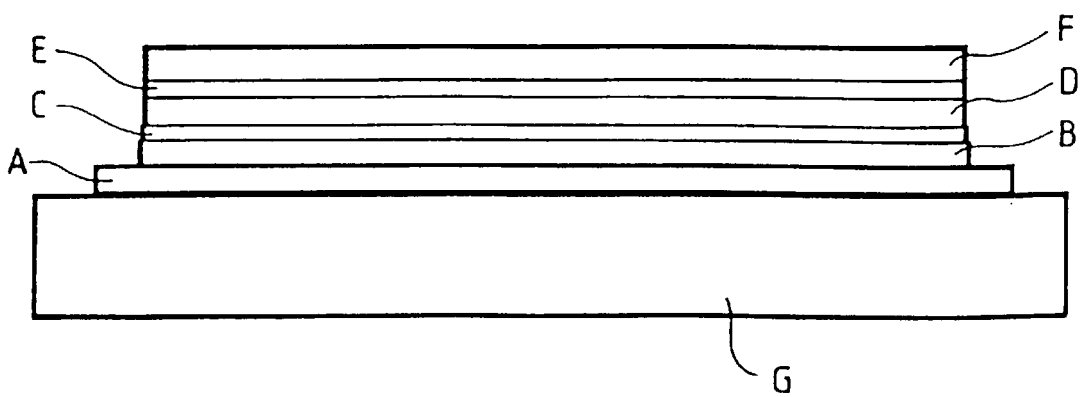
FIG. 2 is a schematic sectional elevation of a multi-layer coating.

Several conducting layers are applied to a substrate using a variation of the process described in Example 1. As shown in FIG. 2, a layer of conductive material B is placed on a suitable membrane A. The conductive layer B is coated with a fluxing agent C, which is then coated with a further conductive layer D. An alternative conductive material, such as a semi-conducting layer E, is placed on conductive layer D. Finally, an insulating layer F is placed on top of the alternative conducting material E. The multi-coated membrane A is then placed on a suitable substrate G for heat treatment using a heat cycle such as that described in Example 1.

The individual layer thicknesses can vary between 0.25 microns to more than 1,000 microns, depending on the particular application.

In an alternative arrangement of the layers shown in FIG. 2,

A is a layer of fluxing material formed as a membrane,
B is a layer of conducting material,
C is a layer of semi-conducting material,
D is a layer of electro-chromatic material,
E is a layer of conducting material,
F is an insulating layer, and
G is a glass substrate.

The material in the conducting layers may suitably comprise a metal in a chloride form.

Heat treatment in a controlled atmosphere which changes from oxidising to neutral to a reducing atmosphere, creates strong interlayer bonds in the multi-coated substrate through sintering between the various layers.

Figure 3:
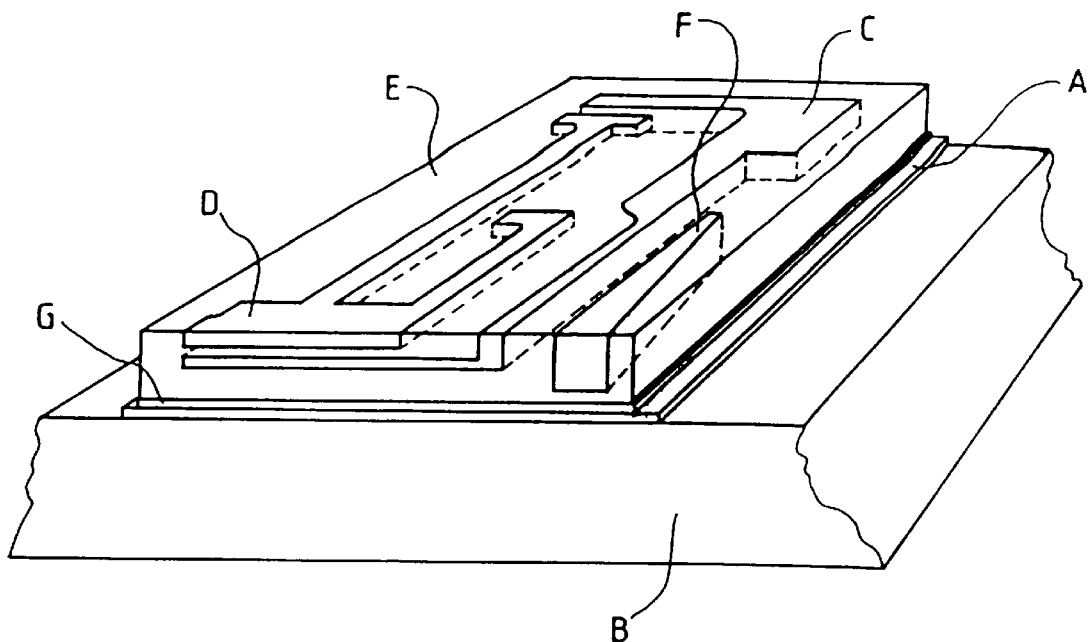
FIG. 3 is a schematic perspective of a multi-layer coating.

In an alternative embodiment, illustrated in FIG. 3,

A is a suitable membrane material,
B is a substrate,
C is a layer of semi-conducting material,
D is a layer of conducting material,
E is a layer of insulating material,
F is a layer of electro-chromatic material, and
G is a layer of conducting material.

By suitable design of the individual layers, discrete zones of conducting and semi-conducting materials can be formed in the finished device, which interconnect and penetrate different layers.

Using layer preparation techniques such as photolithography and the like, virtually any pattern or design can be formed as a layer applied to the base membrane. Complex integrated and/or hybrid circuits can therefore be formed.

EXAMPLE 3

A membrane is placed on a glass substrate. The membrane is a prepared composite material which is chemically and physically compatible with the substrate material. On subsequent heat and/or chemical treatment, the membrane forms an adherent bond with the substrate.

The "prepared composite" material is suitably a lead/borosilicate glass matrix prepared conventionally and powdered as a frit and bound within an organic binder. This composite may alternatively be prepared to high purity by a sol-gel procedure.

Another suitable "prepared composite" material is a barium/borosilicate glass matrix prepared conventionally and powdered as a frit and bound within an organic binder. Again, the composite may be prepared to high purity by sol-gel procedure.

EXAMPLE 4

Several coatings layers are deposited on a membrane, and the membrane is then applied to the substrate.

Advantageously, the membrane material in contact with the substance has a thermal expansion coefficient within $5.0 \times 10^{-6}$ cm/°C. of the substrate material. The membrane comprises vitreous and/or glass/ceramic material having thermal expansion characteristics within $0.4 \times 10^{-6}$ cm °C. of the substrate material. A suitable vitreous/ceramic substrate contact membrane comprises the following ingredients by weight:

$SiO_2$ 5%
$B_2O_3$ 24%
$PbO$ 60%
$ZnO$ 11%

Another suitable semi-conducting substrate contact vitreous membrane comprises the following elements by weight:

$V_2O_5$ 83%
$P_2O_5$ 10%
$BaO$ 7%

The membrane may suitably incorporate semi-conducting and/or electro-chromatic substances.

EXAMPLE 5

A coated membrane is applied to a soda/lime glass substrate, such as the glass panels commonly used for architectural purposes and generally produced using the "float glass" process. The flat glass panel is typically between 2 mm and 30 mm thickness, and preferably has an expansion coefficient of between $7.5 \times 10^{-6}$ cm/°C. and $8.5 \times 10^{-6}$ cm/°C.

The coating includes an electro-chromatic semiconducting layer compound such $TiO_2$ and/or $WO_3$ within a sol-gel or conventionally prepared vitreous/ceramic matrix.

EXAMPLE 6

Large solar cells, even of low to medium efficiency, can be used to clad highrise buildings to generate power thereby offsetting localised energy costs. Modular production capability allows the application of coatings to custom toughened sheets.

A large area photo-voltaic cell has p and n, pn junction semi-conducting vitreous/ceramic contact delineation using Si, and/or n type semi-conductors such as $In_2O_3$, $Cd_2SnO_4$, doped or crystallised within a vitreous medium during heat treatment procedures.

EXAMPLE 7

Another photo-voltaic layered construction suitable for large area substrates comprises the following:

[a] Substrate material—architectural flat glass with coefficient of thermal expansion $7.9-8.0 \times 10^{-6}$/cm °C. by weight.

[b] Substrate contact membrane comprising $SiO_2$ 5%, $B_2O_3$ 15%, PbO 64%, ZnO 16%.

[c] A metal contact layer comprising metal chloride in a volatile colloidal suspension and/or deposited by a sputtering/CVD process. Suitable metals include Al, Ag, Cu, Pt, Au.

[d] p & n, pn junction semi-conducting vitreous/ceramic contact delineation.

[e] An intermediate layer material comprising sol-gel and/or conventionally prepared glass having $Li_2O$—ZnO—$B_2O_3$—$SiO_2$ with the addition of $Al_2O_3$, $La_2O_3$, $Ta_2O_5$, $CeO_2$, $TiO_2$, and $WO_3$.

[f] Another intermediate layer material may include materials such as crystalline Si, Ge, CaAs, CdSe, InP, nucleated within a $Li_2O$—ZnO—$B_2O_3$—$SiO_2$ glass prepared conventionally and/or as a sol-gel.

[g] A metal contact layer comprising metal chloride in a volatile colloidal suspension and/or deposited by a sputtering/CVD process. Metals include Al, Ag, Cu, Pt, Au.

[h] Preferred substrate contact membrane comprising $SiO_2$ 5%, $B_2O_3$ 15% PbO 64%, ZnO 16%.

Layers [c], [d], [e], [f], and [g] may be interchangeable in their relative positions.

EXAMPLE 8

A coated substrate, prior to heat treatment comprises the following layers (a) substrate (b) volatilisable substrate contact material (c) glass powder [compatible with appropriate glass substrates and approximately 50μ particle size (d) conductive material [e.g. Cu, Ag, Pt, Au, W, Ti, and the like]

(e) glass powder [compatible with appropriate glass substrates and approximately 50 μm particle size]

(f) semi-conducting materials [e.g. $TiO_2$, $WO_2$, Se and the like]

(g) glass powder [compatible with appropriate glass substrate and approximately 50 μm particle size].

The substrate contact material can be gold leaf.

EXAMPLE 9

A substrate contact membrane prior to heating comprises gold leaf with glass powder (e.g. powdered frit) thereon. The glass powder is compatible with glass substrates and of approximately 50 μm particle size.

Such abovedescribed coatings and/or circuits can be formed on substrates having curved surfaces or surfaces of complex shape. Unlike prior art methods in which the conducting or semi-conducting layers are applied directly to the substrate, in this invention the conducting/semi-conducting layers are first applied to a membrane. This enables complex, interconnected multi-layer arrangements to be created on a flat membrane, conveniently and accurately. The multi-layer arrangement is then wholly placed on substrate, via the temporary medium of the membrane.

Coated products produced according to this invention will, in most cases, withstand high operating temperatures and possess superior physical/chemical durability.

The method of this invention has application in a wide variety of industrial and scientific fields. Without limiting the scope of the invention, some particular applications are described below.

1. The method can be used to form complex electrodes for use in NMR applications to create electromagnetic fields of desired shape and intensity.
2. The method can also be used to manufacture of solar cells with increased collector-conductor junction efficiency. The method is also suitable for use in making programmable electrophoresis cells, remote sensing/monitoring devices and micro lasing devices.
3. Electrochromatic switching devices can be made using the method of this invention. Such devices can be used for fibre optic signalling and control, variable control window and partition tinting. For example, an electrochromatic layer can be placed on a glass substrate, and the transparency of the resultant structure can be varied by application of a suitable voltage to the electrochromatic layer.

Other uses include photo-chromatic coatings. Reversible sun-light activated coatings can be provided on architectural size glass sheet. Such large scale external applications include sun activated optical darkening/radiation control glazing and cladding.

4. The method is also suitable for post deposition/impregnation techniques, laser deposition/etching and patterning, for example producing devices for super conductor film research.
5. The method can also be used to apply coatings to a tubular glass vessel to provide microcomputer controlled heating, and/or catalytic devices, e.g. micro-fractionation and distillation.
6. The method is suitable for building large scale multi-layer integrated circuits, e.g. to fabricate a single large flat glass screen (typically 2 m×3 m) incorporating pixel sized spots of electro-chromic material connected in such a way that they are able to be activated individually or as multiples.

An electro-chromatic, computer controlled, single or multiple layer coating can be used for display screen applications such as flat TV and video units. A full production glazing sheet can be coated and connected in modular form to create screens in excess of 10 m×10 m.

7. Thick coating mirror applications for harsh external environmental applications. Toughened glass security screen applications.

8. The coating process can be used to chemically toughen glass sheets. The layered coating may incorporate compounds which when subjected to toughening temperatures, impart surface conditioning giving the same finished effect as existing dip ion exchange processes. Combining chemically toughened large glass panels with either electro-chromatic and/or photo-voltaic properties has major advantages over any existing arrays regardless of size.

The foregoing describes only some embodiments of the invention, and modifications which are obvious to those skilled in the art may be made thereto without departing from the scope of the invention as defined in the following claims.

Figure 4:
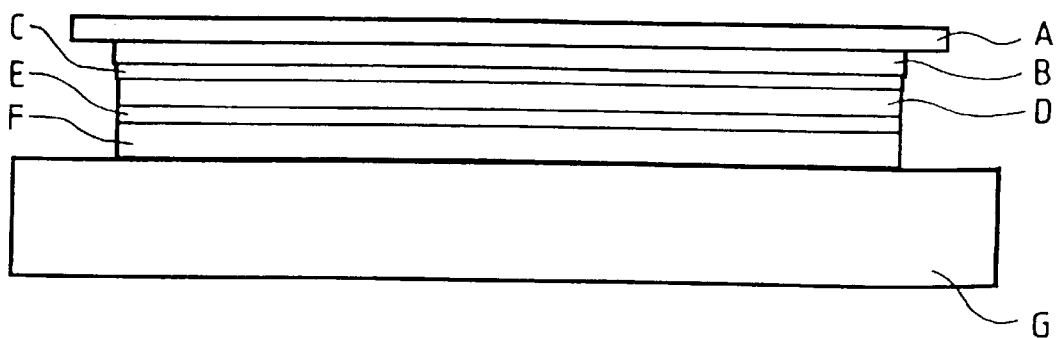
FIG. 4 is a schematic sectional elevation of another multi-layer coating.

For example, in a further embodiment of the invention, the membrane is used in a reverse format as shown in FIG. 4. The membrane material A is of a type which forms a bonding "canopy" over a single or multi-layer coating B, C, D E, F.

In this embodiment, the membrane material A chemically bonds with the substrate G, producing strong adhesion. This is desirable in situations where layer materials will not fuse or chemically bond to each other or the substrate. The membrane material A acts as a continuous glaze of "skin" which holds the coating layer/s B, C, D, E, F tightly together and in position on the substrate surface G. This embodiment is very useful where powders of high melting point metals (e.g. Tungsten) and minerals are needed to be delineated precisely, and held permanently, on a substrate.

I claim:

1. A method of applying a coating to a glass substrate, comprising the steps of
    applying a coating containing photosensitive or electro-chromatic compounds to the surface of a membrane,
    placing the membrane on the glass substrate with the membrane intermediate between the coating and the substrate,
    treating the combination of substrate, membrane and coating under controlled conditions to remove the membrane and enable the coating to bond to the substrate.

2. A method as claimed in claim 1 wherein the treating step includes heating the membrane to cause it to volatilise without leaving any substantial residue on the substrate.

3. A method as claimed in claim 2 wherein the membrane is heated in successively neutral, oxidising and reducing atmospheres.

4. A method as claimed in claim 1 wherein the membrane is formed of a material selected from the group consisting of: diethylene glycol monosterate: polyvinyl alcohol; and cellulose crosslinked matrix combined with starch.

5. A method as claimed in claim 1 wherein the coating is a multilayer coating.

6. A method as claimed in claim 5 wherein the coating is applied progressively to the membrane in a plurality of layers by vacuum evaporation and/or sputtering techniques in predetermined patterns.

7. A method as claimed in claim 5 wherein the coating is applied wholly as a multilayer coating to the membrane.

8. A method as claimed in claim 5 wherein the coating includes a fluxing material, and the treating step includes heating the combination to cause the fluxing material to interbond the layers of the coating, or the coating to the substrate.

9. A method of applying a coating to a non-conductive substrate, comprising the steps of
    applying the coating to the surface of a membrane in a photolithographic process,
    placing the membrane on the substrate with the membrane intermediate between the coating and the substrate,
    then treating the combination of substrate, membrane and coating under controlled conditions to remove the membrane and enable the coating to bond to the substrate.

10. A method of applying a coating to a non-conductive substrate, comprising the steps of
    applying the coating to the surface of a membrane,
    placing the membrane on the substrate with the membrane intermediate between the coating and the substrate,
    then heating the combination of substrate, membrane and coating in successively neutral, oxidising and reducing atmospheres to cause the membrane to volatilise without leaving any substantial residue on the substrate and thereby enable the coating to bond to the substrate.

11. A method as claimed in claim 10 wherein the heating step includes gradually raising the temperature of the neutral atmosphere to approximately 620° C. to cause volatilisation of the membrane, changing the atmosphere to an oxidising atmosphere and maintaining the temperature at approximately 620° C. for a predetermined period of time, raising the temperature to approximately 1200° C. for a predetermined period of time in a reducing atmosphere, and allowing the substrate to cool in a neutral atmosphere.

12. A method as claimed in claim 10 wherein the treating step occurs in a vacuum chamber.

13. A method as claimed in claim 10 wherein the membrane is formed of a material selected from the group consisting of: diethylene glycol monosterate, polyvinyl alcohol, and cellulose crosslinked matrix combined with starch.

14. A method as claimed in claim 10 wherein the coating is applied to the membrane in the form of fine metallic powder in a liquid or gel medium.

15. A method as claimed in claim 14 wherein the coating is deposited on the membrane in a silk screening or stencilling process.

16. A method as claimed in claim 10 wherein the coating is applied to the membrane in a colloidal state.

17. A method as claimed in claim 10 wherein the coating is a multilayer coating.

18. A method as claimed in claim 17 wherein the coating is applied progressively to the membrane in a plurality of layers by vacuum evaporation and/or sputtering techniques in predetermined patterns.

19. A method as claimed in claim 17 wherein the coating is applied wholly as a multilayer coating to the membrane.

20. A method as claimed in claim 10 wherein the substrate is glass.

21. A method for applying a coating to a non-conductive substrate, comprising the steps of
    applying the coating to the surface of a membrane,
    placing the membrane on the substrate with the membrane intermediate between the coating and the substrate,
    then treating the combination of substrate, membrane and coating under controlled conditions by dissolving the membrane to enable the coating to bond to the substrate.

22. A method of applying a coating to a non-conductive substrate, comprising the steps of
depositing the coating on a silica gel membrane,
placing the membrane on a substrate the membrane having a substrate contact material which is chemically or physically compatible with the substrate material,
treating the membrane chemically or thermally to form an adherent bond with the substrate.

23. A method as claimed in claim 22 wherein the coating is located intermediate the membrane and the substrate.

* * * * *